United States Patent [19]

Connerney et al.

[11] Patent Number: 4,955,079

[45] Date of Patent: Sep. 4, 1990

[54] WAVEGUIDE EXCITED ENHANCEMENT AND INHERENT REJECTION OF INTERFERENCE IN A SUBHARMONIC MIXER

[75] Inventors: William R. Connerney, Needham, Mass.; Mark E. Raposo, Nashua, N.H.; Winslow G. Round, Merrimack; Raymond T. Pavio, Lexington, both of Mass.

[73] Assignee: Raytheon Company, Lexington, Mass.

[21] Appl. No.: 414,340

[22] Filed: Sep. 29, 1989

[51] Int. Cl.⁵ .............................................. H04B 1/26
[52] U.S. Cl. .................................... 455/325; 455/327; 455/328
[58] Field of Search ............... 455/325, 327, 328, 330, 455/302–306, 317, 319

[56] References Cited

U.S. PATENT DOCUMENTS

| | | | |
|---|---|---|---|
| 3,515,993 | 6/1970 | Merriam | 455/326 |
| 4,457,022 | 6/1984 | Pydyk | 455/330 |
| 4,485,488 | 11/1984 | Houdart | 455/330 |
| 4,509,208 | 4/1985 | Sogo et al. | 455/330 |
| 4,654,887 | 3/1987 | Murphy et al. | 455/327 |
| 4,817,201 | 3/1989 | Bonato | 455/330 |

*Primary Examiner*—Reinhard J. Eisenzopf
*Assistant Examiner*—Andrew Faile
*Attorney, Agent, or Firm*—Donald F. Mofford; Denis G. Maloney; Richard M. Sharkansky

[57] ABSTRACT

A subharmonic mixer is shown to comprise two pairs of matched antiparallel GaAs diodes disposed on a dielectric slab and operative with microstrip circuitry. By suppressing the fundamental mixing products, mixing the radio frequency signal with the second harmonic of a local oscillator (LO) signal and using relative phase differences of the LO signals in the two pairs of diodes, undesirable effects from spurious signals are minimized.

9 Claims, 3 Drawing Sheets

WAVEGUIDE EXCITED ENHANCEMENT AND INHERENT REJECTION OF INTERFERENCE IN A SUBHARMONIC MIXER

BACKGROUND OF THE INVENTION

This invention pertains generally to balanced mixers, and particularly to a balanced mixer wherein pairs of diodes are arranged to form a subharmonic mixer.

In a typical radar receiver, it is desirable to reduce any undesirable effect of spurious signals by the use of appropriate line filters to selectively attentuate any spurious signals. Such circuitry increases the complexity of the receiver and decreases receiver performance. As technology improves, radar signals at higher and higher frequencies are possible. At higher frequencies, component insertion losses increase and components of any known type of mixer used at higher frequencies have a greater effect in limiting the sensitivity of the receiver. It is, therefore, desirable to provide a mixer with inherent filtering properties, such mixer being capable of suppressing spurious and image signals, having a low conversion loss and being physically simpler than typical mixers.

SUMMARY OF THE INVENTION

With the foregoing background of this invention in mind, it is a primary object of this invention to provide a mixer inherently adapted to suppress both spurious and image signals without requiring separate filters.

Another object of this invention is to provide a mixer having low conversion loss using signal enhancement.

Still another object of this invention is to provide a mixer having physical simplicity.

A still further object of this invention is to provide a mixer wherein high peak power protection is not needed.

The foregoing and other objects of this invention are met generally by a mixer using two pairs of anti-parallel diodes as mixing elements disposed on a thin substrate, each pair of diodes producing an intermediate frequency signal which is supplied to a respective port of a quadrature hybrid having four ports. The substrate is positioned in the transverse plane of a waveguide so that the diodes intercept the RF energy in the waveguide. A local oscillator signal is applied to an input port of a 3 dB power divider producing a first and second local oscillator (LO) signal, the second LO signal being delayed 45° in phase, producing a 90° phase shift for the second harmonic of the second LO signal as each LO signal is applied to a respective pair of diodes. A first intermediate IF signal is produced by the first pair of diodes and applied to the first port of the quadrature hybrid. A second intermediate IF signal is produced by the second pair of diodes and applied to a second port of the quadrature hybrid. The first intermediate IF signal, having a phase that leads by 90° the phase of the second intermediate IF signal, is summed with the second intermediate IF signal in the quadrature hybrid to produce a total desired IF signal at a third port of the quadrature hybrid. A first and second image IF signal produced by the first and second diode pair, respectively, are also applied to the first and second ports, respectively, of the quadrature hybrid. The first image IF signal, having a phase that lags by 90° the phase of the second image IF signal, is summed with the second image IF signal in the quadrature hybrid to produce a total image IF signal at the fourth port of the quadrature hybrid. Hence, the desired IF signal and the image IF signal are separated by the quadrature hybrid into two distinct ports such that the desired IF signal is then processed while the image IF signal is terminated.

BRIEF DESCRIPTION OF THE DRAWINGS

For a more complete understanding of this invention reference is now made to the following description of the accompanying drawings wherein.

DESCRIPTION OF THE PREFERRED EMBODIMENT

Figure 1:
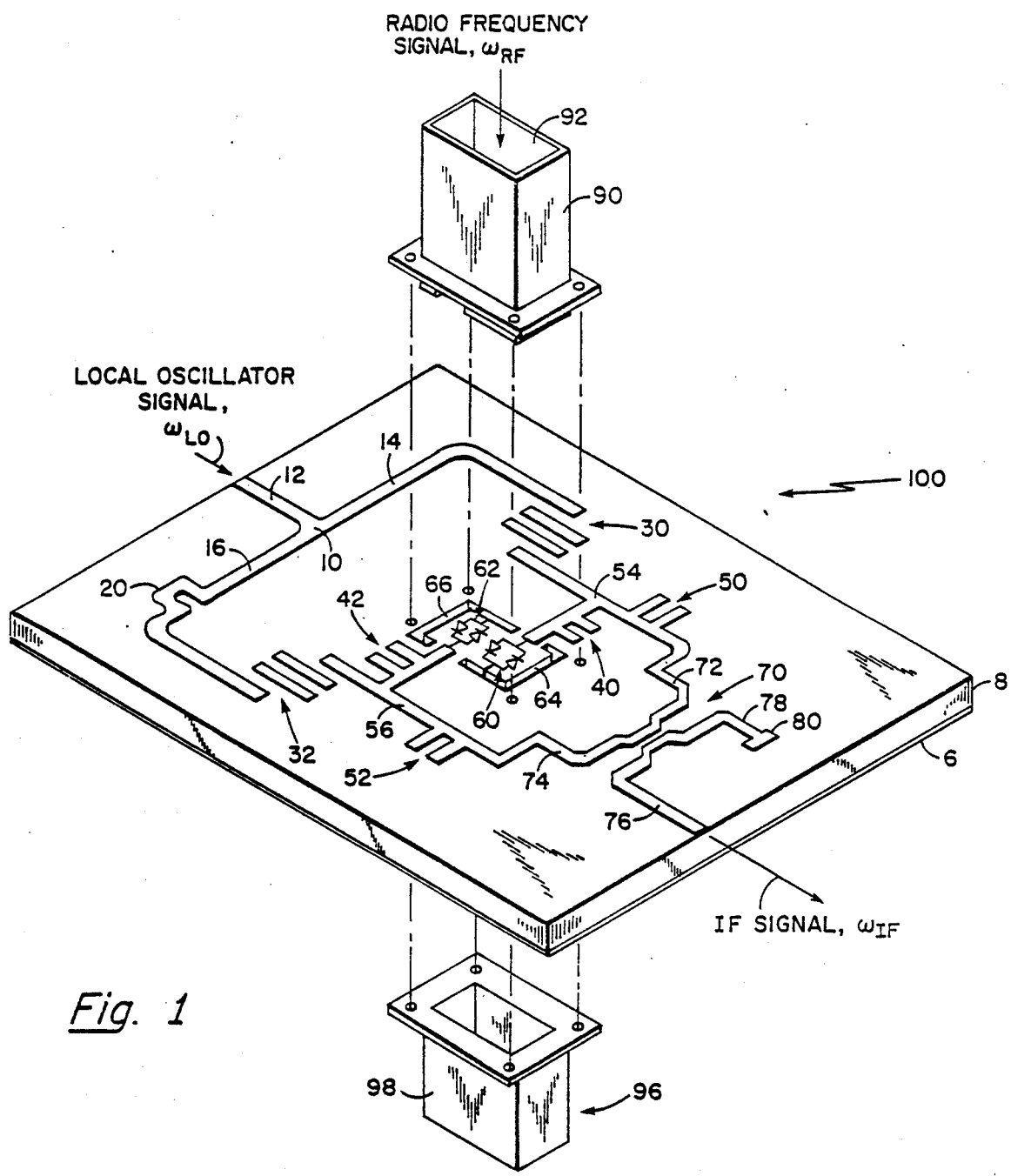
FIG. 1 is an isometric view, somewhat distorted, the better to illustrate details, of a subharmonic mixer according to this invention.

Referring now to FIG. 1, circuit elements of a subharmonic mixer 100 are shown to be an oscillator port 12, a radio frequency (RF) input port 92, a 3 dB divider 10, a first and a second branch arm 14, 16, a first and a second bandpass filter 30, 32, a first and a second low pass filter 40, 42, a first and a second pair 60, 62 of diodes, a first and a second local oscillator (LO) choke 50, 52, a quadrature hybrid 70 connected to the first and second LO choke 50, 52 at ports 72, 74, as shown, an output port 76 and a matched load 80 connected to the quadrature hybrid 70 at port 78. The just-mentioned circuit elements (except for the RF input port 92) are printed circuit elements disposed on one surface (not numbered) of a dielectric slab 8. A ground plane 6 is formed on the opposing surface (except the portion of such surface defined by the inside of a section of waveguide 98). As described hereinafter, a radio frequency signal (at a frequency, $\omega_{RF}$) incident on input port 92 passes through a section waveguide 90 to be mixed in the first and the second pair 60, 62 of diodes with an even order harmonic (here a second harmonic derived from a local oscillator signal) at a frequency ($\omega_{LO}$) introduced at oscillator port 12. The intermediate frequency (IF) signal at the output port 76 then has a frequency $\omega_{IF}$ equal to ($\omega_{RF} - 2\,\omega_{LO}$).

Figure 2:
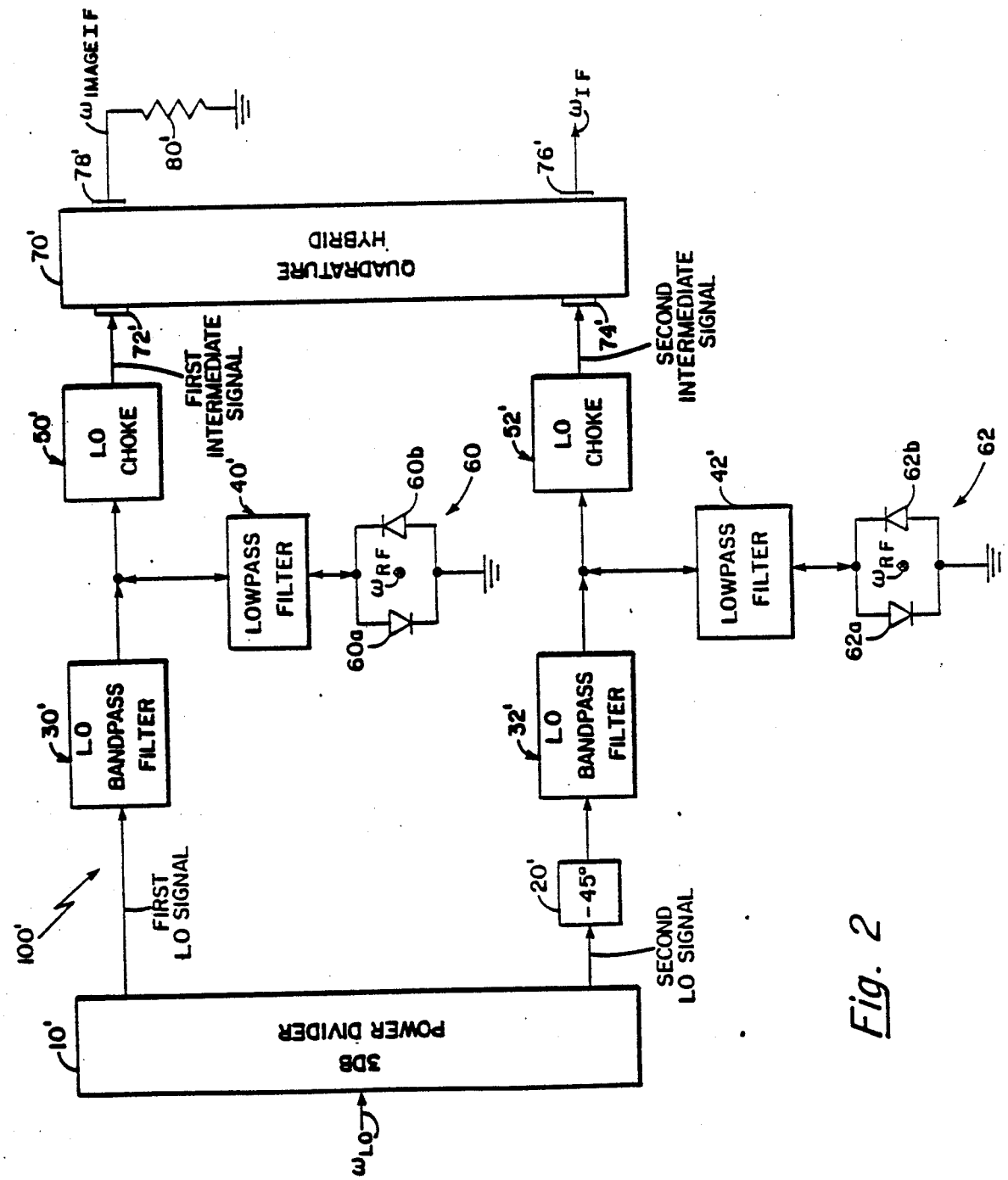
FIG. 2 is a schematic diagram of the subharmonic mixer according to this invention.

Referring now to FIG. 2, it may be seen that the LO signal is applied to a 3 dB power divider 10' to be divided into two substantially equal portions designated as a first and a second LO signal. The first LO signal is applied to a bandpass filter 30'. The insertion loss of the bandpass filter 30' is low at the LO frequency and the insertion loss of such filter is high at substantially any other frequencies of interest here. After passing through bandpass filter 30', the first LO signal is applied to a low pass filter 40' and to an LO choke 50. The insertion loss of the low pass filter 40' at the RF frequency and image frequency is high. At the LO and IF frequencies the insertion loss of the low pass filter 40' is low. The insertion loss of the LO choke 50' is high for all frequencies above the derived IF frequency, so the first LO signal is passed only through the low pass filter 40'. After passing through the low pass filter 40', the first LO signal is applied to the pair 60 of diodes 60a, 60b. Pair 60 is referred to as an anti-parallel diode pair, meaning that the two diodes 60a, 60b are connected in parallel with the anode of each one connected to the cathode of the other. If the individual diodes, here diode 60a and 60b, are matched or approximately identical to each other, the relative phase and amplitude of an IF signal created by the fundamental mixing response in each diode is such that the IF signal is cancelled as the IF signal attempts to leave the diode pair 60. The IF signal exists in the diode pair only. When LO and RF signals are applied to the diode pair 60, diode 60a will conduct during each positive going half cycle of the beat frequency signal, i.e., the LO signal, and will be nonconductive during the negative going half cycle. Diode 60b will only conduct when diode 60a is nonconductive. It follows that the conductance waveforms generated by the diodes 60a, 60b, are 180° out-of-phase. Consequently, the individual IF currents out of the diodes 60a, 60b are 180° out-of-phase. In effect, each one of the diodes 60a, 60b terminates the other in a short circuit at beat frequencies corresponding to the fundamental IF frequency and odd harmonics thereof. The total current that flows in the lead connected to pair 60 of diodes will contain only odd mixer products, meaning frequencies for which M+N is an odd integer where, M is an integer representing an even multiple of the LO frequency and N is an integer representing an odd multiple of the RF frequency.

Figure 3:
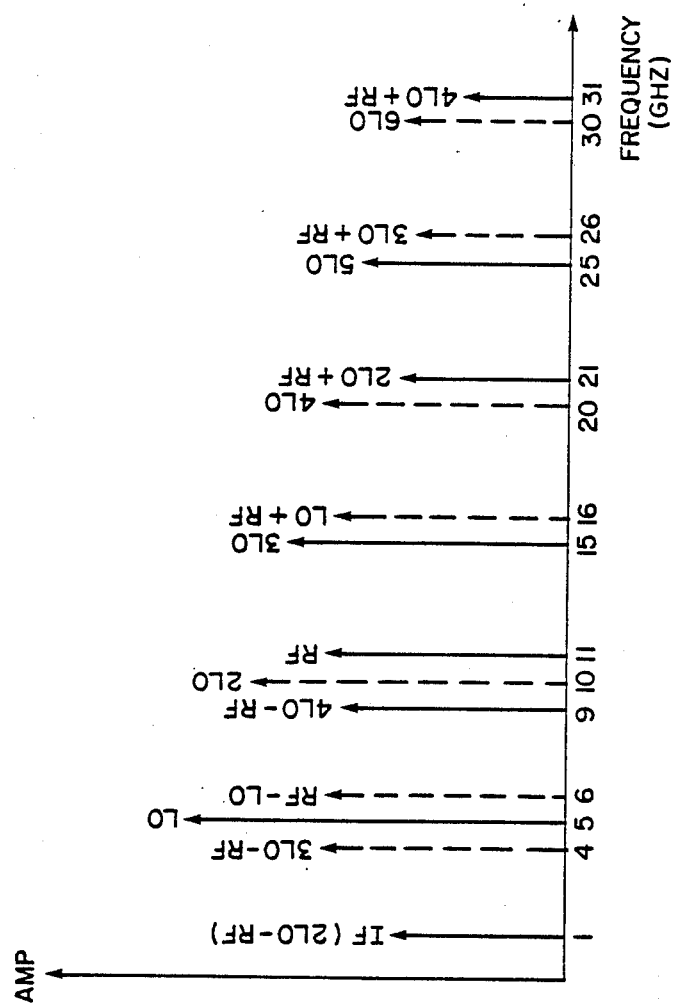
FIG. 3 is a sketch illustrating, in the "small-signal" case, the relative amplitude and frequency separation between various signals generated in a nonlinear mixing process as used in this invention.

Referring momentarily to FIG. 3, with an RF signal having a frequency of 11 GHz and a LO signal having a frequency of 5 GHz applied to the pair 60 of diodes (FIG. 2), a frequency spectrum of the resulting mixing products is shown. The solid lines represent frequencies which are present in the output lead of the pair 60 of diodes. The dashed lines represent frequencies which are inherently suppressed and although existing in the circulating current, do not appear in the output lead of the pair 60 of diodes. Only the fundamental RF signal is considered because the level of higher odd harmonics of the RF signal produced by the mixing response is ordinarily so low as to be insignificant. As to be described hereinafter, it is noted note that the frequency present on the output lead of the pair 60 of diodes resulting from mixing of the fourth harmonic of the first LO signal and the RF signal is an internally created image signal having a frequency equal to the difference between four times the LO frequency minus the RF frequency. Therefore, since the RF signal is applied as the upper sideband of the second harmonic signal, meaning the RF frequency is higher than the second harmonic frequency, then the image signal is the lower sideband.

An RF signal incident on pair 60 of diodes will heterodyne with the second harmonic of the local oscillator signal to produce a first intermediate signal (2 LO−RF) having a frequency, $\omega_{IF}$, also known as the difference frequency, which is equal in frequency to the difference between twice the frequency of the local oscillator signal and the frequency of the RF signal. A sum signal (2 LO+RF) is also produced having a frequency equal to the sum of twice the frequency of the local oscillator and the frequency of the RF signal, as well as signals at other frequencies that appear in the output of the pair 60 of diodes. However, it will become apparent that such signals may be attenuated by an appropriate filter.

The signals produced by pair 60 of diodes are applied to low pass filer 40' with a pass band centered at $\omega_{IF}$. As stated earlier, low pass filter 40' has a high insertion loss at the image frequency and the RF frequency and a low insertion loss at the LO and IF frequency. Consequently, signals with frequencies outside the pass band are blocked from the signal path by low pass filter 40', meaning that only the first intermediate signal (at frequency $\omega_{IF}$) of the signals created at pair 60 of diodes passes through the low pass filter 40'. Upon leaving the low pass filter 40', the first intermediate signal is passed to LO choke 50' which has a high insertion loss at the LO frequency and a low insertion loss at the IF frequency $\omega_{IF}$. Thus, LO choke 50' will allow the first intermediate signal to pass through while preventing the LO signal from passing through. It should also be noted that LO bandpass filter 30' has a high insertion loss at the IF frequency thus preventing the first intermediate signal from traveling in that direction. Upon leaving LO choke 50', the first intermediate signal is applied to first port 72' (an input port) of quadrature hybrid 70'. Quadrature hybrid 70' is described herinafter.

Looking now at the second LO signal, upon leaving the 3 dB power divider 10', the phase of the second LO signal is delayed by 45° by phase shifter 20' (which corresponds to a 90° delay at the second harmonic) before being applied to bandpass filter 32'. It will be evident now that, because the circuitry in the output line of the pair 62 of diodes 62a, 62b corresponds with the circuitry in the output line of the pair 60 of diodes 62a, 62b, a second intermediate signal appearing at the second input port 74' of quadrature hybrid 70' will correspond with the first intermediate signal appearing at the first port 72' of the quadrature hybrid 70'.

It will be appreciated by those of skill in the art that at ports 72', 74' the first intermediate signal will have a phase that leads by 90° the phase of the second intermediate signal. Alternatively, it will be appreciated that when the second harmonic signal mix with image signals to produce a first and second image intermediate signal, respectively, at ports 72', 74', the first image intermediate signal will have a phase that lags by 90° the phase of the second image intermediate signal. Therefore, at ports 72', 74' of quadrature hybrid 70', the first intermediate signal at port 72 will have a phase that leads by 90° the phase of the second intermediate signal at port 74'. Using the quadrature hybrid 70' to combine the first and second intermediate signals, such signals will add at port 76' producing an IF signal and cancel at port 78'. Alternatively, since the first image intermediate signal at input port 72' will have a phase that lags by 90° the phase of the second image intermediate signal at input port 74', the quadrature hybrid 70' will combine such signals such that the signals add at port 78', producing an image IF signal, and cancel at port 76'. Therefore, the IF signal and the image IF signal are separated by the quadrature hybrid 70' into two distinct ports 76', 78'. The desired IF signal is then processed while the image IF signal is terminated in the method load 80' (also known as a termination load 80'.)

Referring now to FIG. 1, an illustrated embodiment using conventional microstrip techniques to fabricate the contemplated circuitry on one surface of the slab 8 is shown. In the illustrated embodiment an input LO signal is applied at oscillator port 12. Such signal is divided substantially equally by 3 dB power divider 10 into a first and second LO signal. The first LO signal travels along first branch arm 14. Branch arm 14 is segmented in a known manner to form the bandpass filter 30 so that only signals at $\omega_{LO}$ may pass (meaning that signals at $\omega_{IF}$ may not pass) over the arm. The first LO signal continues passing through low pass filter 40 and is applied to pair 60 of diodes. The second LO signal travels along second branch arm 16 which includes phase shifter 20, a section of the arm adapted to delay by 45° the phase of the second LO signal (which corresponds to a 90° delay at the second harmonic). Branch arm 16, like branch arm 14, is segmented in a known manner to form a bandpass filter 32. Following branch arm 16 the second LO signal continues, passing through low pass filter 42, and is applied to pair 62 of diodes.

An RF signal having a frequency, $W_{RF}$, incident on RF input port 92, travels along waveguide 90, striking pairs 60, 62 of diodes. Waveguide 90 is mounted on the slab 8 such that the pairs 60, 62 of diodes intercept the RF signal in the waveguide 90. RF signals not striking the pairs 60, 62 of diodes travel down waveguide 98 which is mounted opposite waveguide 90. Termination end 96 absorbs stray RF signals while maximizing the RF signal across the pairs 60, 62 of diodes. A first and a second groove 64, 66 extending to the ground plane 6 partially encircle pairs 60, 62 of diodes, as shown, such that as wavegvuide 90 is mounted on slab 8, waveguide 90 is firmly grounded through grooves 64, 66 to ground plane 6 while isolated from each lead connecting pairs 60, 62 of diodes to low pass filters 40, 42, respectively.

It should be noted that typically R.F. limiters are needed to protect the R.F. mixer diodes from high peak power burnout, but due to the anti-parallel feature of the diode pair, high peak power protection is not need. When the voltage across a diode pair exceeds a few tenths of a volt, the diode having forward conduction in the diode pair conducts, thus preventing the voltage from increasing further.

As described hereinbefore, RF signals incident on the pairs 60, 62 of diodes mix with the second harmonic signals produced by the pairs 60, 62 of diodes when excited by the LO signals respectively to produce a first intermediate signal in pair 60 of diodes and a second intermediate signal in pair 62 of diodes. Each of the pairs 60, 62 of diodes will also produce an image signal and an image intermediate signal, as appropriate. A portion of each of the internal image signals as created in each pair 60, 62 of diodes sends a portion of the signal having a phase opposite the other signal along the waveguide 90 and each portion of the image signal cancels the other so that the total internal image signal transmitted along the waveguide 90 to the source (not shown) is zero. Such a feature of the mixer 100 is an inherent property and is accomplished without R.F. signal filtering.

The first intermediate signal passes through low pass filter 40 and travels along microstrip lead 54, through choke 50, and is applied to port 72 of quadrature hybrid 70. Low pass filter 40 (also referred to as image filter 40) is incorporated in a known manner into the microstrip lead to reflect the internally created image signal which is traveling along the microstrip lead, back to the pair 60 of diodes where such signal is reconverted to enhance the desired IF signal. The image filter 40 reflects the image signal such that the signal created adds in phase to the first intermediate signal, thereby enhancing the first intermediate IF signal.

It will be appreciated by those of skill in the art, since mixer 100 has a signal enhancement feature, the requirement for a low noise amplifier in a receiver (not shown) may be eliminated. LO choke 50 is incorporated in a known manner using two quarter-wave open stubs into microstrip lead 54 to reject the LO signal, thus preventing the LO signal from traveling along microstrip lead 54. It should be evident that bandpass filter 32, low pass filter 42, LO choke 52 and pair 62 of diodes correspond to bandpass filter 30, low pass filter 40, LO choke 50 and pair 60 of diodes so that the second intermediate signal will appear at the second port 74 of quadrature hybrid 70. It will be appreciated by those of skill in the art, since the LO frequency is approximately half that of the image frequency, filters with excellent isolation between the image signal and the LO signal can be readily achieved.

Quadrature hybrid 70 may be of any type, having four ports and functioning as the one described herein. Quadrature hybrid 70 is a four port hybrid junction, disposed on the slab 8, having a first and second port 72, 74 used as input ports and a third and fourth port 76, 78 used as output ports. Thus, quadrature hybrid 70 is adapted to transfer, entirely and equally, signals from the first port 72 to the third and fourth ports 76, 78, with the signal at the fourth port 78 having a phase that leads by 90° the phase of the signal at the third port 76. Furthermore, quadrature hybrid 70 is adapted to transfer, entirely and equally, signals from the second port 74 to the third and fourth ports 76, 78 with the signal at the fourth port 78 having a phase that lags by 90° the phase of the signal at the third port 76. As described hereinbefore, the relative phase differences between the first and second intermediate signal and the first and second image intermediate signal applied to the ports 72, 74 of quadrature hybrid 70 cause the quadrature hybrid 70 to separate the desired IF signal from the image IF signal.

It should now be readily apparent that an external image signal incident on the pairs 60, 62 of diodes will be rejected by the disclosed invention as well as the internally created image signal. Also, two undesired signals having a difference frequency equal to the IF frequency will not affect the mixer since this type of excitation is analogous to fundamental mixing and is inherently cancelled by the antiparallel pair of diodes.

Having described this invention, it will now be apparent to one of skill in the art that changes could be made without departing from the inventive concepts. For example, the fourth harmonic of the LO signal could be used to mix the RF signal to produce a desired IF signal and an appropriate phase shift performed on the second LO signal to produce the desired results in the mixer. It is felt, therefore, that this invention should not be restricted to its disclosed embodiment, but rather should be limited only by the spirit and scope of the appended claims.

What is claimed is:

1. In microstrip circuitry wherein a ground plane is formed on one surface of a slab fabricated from a dielectric material and printed circuitry is formed on a second opposing surface of the slab to define signal paths for a local oscillator and for beat frequency signals including desired IF signals, the printed circuitry being disposed to form a heterodyning arrangement responsive to coupled RF signals and to the LO signal to produce the desired IF signals, such circuitry comprising:

(a) a 3 dB divider having an input port for receiving the LO signal and a first and a second output arm dimensioned to produce a first and a second LO signal with a phase difference of 45° between such signals;

(b) a first pair of diodes, each having an anode and a cathode, connected between the first output arm of the 3 dB divider and the ground plane, the anode of each one of the diodes being connected to the cathode of the other one of the diodes, the first pair of diodes also being optically coupled to RF signals, to produce a first spectrum of IF signals including a first portion of the desired IF signals;

(c) a second pair of diodes, similar to the first pair of diodes, connected between the second output arm of the 3 dB divider and the ground plane, the second pair of diodes also being optically coupled to RF signals, to produce a second spectrum of IF signals including a second portion of the desired IF signals in quadrature with the first portion of desired IF signals from the first pair of diodes; and (d) a quadrature hybrid having a first and a second input port and a first and a second output port, said first input port being responsive to the first portion of the desired IF signals from the first pair of diodes and said second input port being responsive to the second portion of the IF signals from the second pair of diodes with said first portion and said second portion of the desired IF signals being substantially in phase at the first output port and substantially 180° out-to-phase at the second output port.

2. The microstrip circuitry as in claim 1, such circuitry further comprising a first and second low pass filter, each low pass filter having a first and second lead, the first low pass filter disposed in series between the first output arm of the 3 dB divider and the first pair of diodes such that the first lead of the first low pass filter is connected to the first pair of diodes and the second lead of the first low pass filter is connected to the first output arm and the second low pass filter disposed in series between the second output arm of the 3 dB divider and the second pair of diodes such that the first lead of the second low pass filter is connected to the second pair of diodes and the second lead of the second low pass filter is connected to the second output arm.

3. The microstrip circuitry as in claim 2, such circuitry further comprising a first and second bandpass filter, the first bandpass filter disposed in series between the first output arm of the 3 dB divider and the second lead of the first low pass filter and the second bandpass filter disposed between the second output arm of the 3 dB divider and the second lead of the second low pass filter.

4. The microstrip circuitry as in claim 3, such circuitry further comprising a first and second local oscillator (LO) choke, the first LO choke disposed in series between the first input port of the quadrature hybrid and the second lead of the first low pass filter and the second LO choke disposed in series between the second input port of the quadrature hybrid and the second lead of the second low pass filter.

5. The microstrip circuitry as in claim 4 wherein each diode of the first and second pair of diodes is a gallium arsenide diode.

6. The microstrip circuitry as in claim 5 further comprising a termination load connected at the second output port of the quadrature hybrid.

7. The microstrip circuitry as in claim 6 wherein each of the first and second low pass filters comprises means for reflecting an internally created image signal back toward the respective pair of diodes.

8. The microstrip circuitry as in claim 7, having additionally a waveguide capable of propagating the R.F. signal, the waveguide disposed such that the pairs of diodes are substantially at the center of the waveguide.

9. The microstrip circuitry as in claim 8 having additionally a waveguide, the waveguide further comprising means for terminating the RF signals propagating in the waveguide such that the RF signals are maximized at the pairs of diodes.

* * * * *